United States Patent

Livengood et al.

[11] Patent Number: 5,952,247
[45] Date of Patent: Sep. 14, 1999

[54] METHOD OF ACCESSING THE CIRCUITRY ON A SEMICONDUCTOR SUBSTRATE FROM THE BOTTOM OF THE SEMICONDUCTOR SUBSTRATE

[75] Inventors: Richard H. Livengood, Fremont; Paul Winer, Santa Clara; Valluri R. Rao, Saratoga, all of Calif.

[73] Assignee: Intel Corporation, Santa Clara, Calif.

[21] Appl. No.: 08/724,223

[22] Filed: Oct. 2, 1996

Related U.S. Application Data

[63] Continuation of application No. 08/344,149, Nov. 23, 1994, abandoned.

[51] Int. Cl.[6] .................................................. H01L 21/00
[52] U.S. Cl. .............................. 438/734; 438/8; 438/14; 438/735; 438/737; 216/65
[58] Field of Search ........................... 438/6, 7, 8, 9, 438/10, 14, 15, 16, 17, 18, 735, 737, 734, 710, 712; 216/17, 18, 21, 33, 39, 59, 60, 61, 65, 67

[56] References Cited

U.S. PATENT DOCUMENTS

| | | | |
|---|---|---|---|
| 4,632,724 | 12/1986 | Chesebro et al. | 156/626.1 |
| 4,650,744 | 3/1987 | Amano | 156/626.1 |
| 4,732,646 | 3/1988 | Elsner et al. | 156/626.1 |
| 5,064,498 | 11/1991 | Miller | 156/626.1 |
| 5,268,065 | 12/1993 | Grupen-Shemansky | 156/662.1 |
| 5,805,421 | 9/1998 | Livengood et al. | 216/59 X |

FOREIGN PATENT DOCUMENTS

| | | | |
|---|---|---|---|
| 0 295 065 | 12/1988 | European Pat. Off. | 156/627.1 |
| 56-46534 | 4/1981 | Japan | 156/626.1 |
| 59-44827 | 3/1984 | Japan | 156/626.1 |
| 1-119037 | 5/1989 | Japan | 156/627.1 |

*Primary Examiner*—William Powell
*Attorney, Agent, or Firm*—Blakely, Sokoloff, Taylor & Zafman

[57] ABSTRACT

A method for accessing a portion of an integrated circuit formed on top of a semiconductor substrate from the bottom of the semiconductor substrate. First, alignment marks are located which are approximately aligned to the integrated circuit. These alignment marks are then used in conjunction with a circuit diagram of the integrated circuit to determine the point on the bottom of the semiconductor substrate residing beneath the portion of the integrated circuit which the practitioner desires to access. Finally, an opening is etched into the bottom of the semiconductor substrate at this point.

63 Claims, 6 Drawing Sheets

METHOD OF ACCESSING THE CIRCUITRY ON A SEMICONDUCTOR SUBSTRATE FROM THE BOTTOM OF THE SEMICONDUCTOR SUBSTRATE

This is a continuation of application Ser. No. 08/344,149, filed Nov. 23, 1994, now abandoned.

FIELD OF THE INVENTION

The present invention relates to the field of integrated circuit testing and more particularly to a method of probing an integrated circuit.

BACKGROUND OF THE INVENTION

Once a newly designed integrated circuit (IC) has been formed on a silicon substrate, the IC must be thoroughly tested to be sure that the circuit performs as intended. Any portion of the IC which does not function properly must be identified so that it can be fixed by modifying the design of the IC. This process of testing an IC to identify problems with its design is known as debugging. After debugging the IC and correcting any problems with its design, the final, fully functional IC designs are used to mass produce the IC's in a manufacturing environment for consumer use.

During the debugging process, it is often necessary to probe certain electrical interconnect lines in order to obtain important electrical data from the IC, such as, for example, voltage levels, timing information, current levels, and thermal information. A typical IC device contains multiple layers of metal interconnects. However, the metal interconnects in the first metal layer of an IC device generally carry the most valuable electrical data for debugging purposes. Metal interconnect lines in the first metal layer reside closest to the silicon substrate and are usually directly coupled to important components of the IC device such as transistors, resistors, and capacitors. It is the electrical data received, manipulated, and transmitted by these components which a designer is most interested in analyzing during the debugging process.

FIG. 1a illustrates a surface view of the top side of an IC device. Metal interconnect lines and components of IC device 11 have been formed on an underlying silicon substrate. The side of the silicon substrate upon which the IC is formed shall herein be referred to as the top side of the silicon substrate. As illustrated in FIG. 1a, bond pads 13 are located along the periphery of IC device 11. In the center of IC device 11 is the active region 12 containing the majority of the high density, active circuitry of IC device 11. It is within active region 12 that most probing takes place during the debugging process. While probing the interconnect lines in active region 12, it is necessary to externally supply the proper voltage signals to bond pads 13 to activate the circuitry within the active region. These voltage signals are supplied to bond pads 13 through a package to which IC device 11 is affixed.

FIG. 1b illustrates a cross-section of IC device 11 after being packaged. After IC device 11 is affixed to package substrate 15, individual bond wires 14 are used to electrically couple each bond pad 13 to a corresponding pad on package substrate 15. Each corresponding pad on package substrate 15 is then individually coupled to an external pin 16. The packaged IC device of FIG. 1b may then be placed within a socket in order to electrically couple external pins 16 to drivers which supply the necessary voltage signals to activate IC device 11. As illustrated in FIG. 1b, IC device 11 is mounted to package substrate 15 with its top side facing away from package substrate 15. In this manner, once IC device 11 is activated through package pins 16, the internal, active region 12 may be accessed and probed since neither bond pads 13, package substrate 15, nor bond wires 14 obscure access to this region of IC device 11.

There are several problems with the design of IC device 11 and its method of packaging. One problem stems from the fact that as the density and complexity of IC device 11 increases, so must the number of bond pads required to control the functions of IC device 11. However, there is only a finite number of bond pads 13 which can fit along the periphery of IC device 11. One way to fit more bond pads along the periphery of the IC device is to increase the overall size of the device thereby increasing its peripheral area. Unfortunately, this also significantly increases the IC manufacturing costs. Another problem with IC device 11 is that the active circuitry within region 12 must be routed to the peripheral region of IC device 11 in order to be electrically coupled to bond pads 13. By routing these interconnect lines over this relatively long distance across the IC, the increased resistive, capacitive, and inductive effects of these lengthy interconnect lines result in speed reduction of the IC device. In addition, the inductance of the bond wires 14 will also severely limit the high frequency operation of IC devices in these packages.

Techniques have been employed to overcome these and other limitations of the design and packaging of IC device 11. FIG. 2a illustrates a top side view of IC device 20. As illustrated in FIG. 2a, bond pads 21 have been formed along the top of the entire IC device so that the bond pads now reside directly over the active circuitry region of IC device 20. By forming bond pads in both the center and periphery of IC device 20, more bond pads can be placed across the surface of the device than can be placed only within the peripheral region. In addition, active circuitry which underlies bond pads 21 of IC device 20 can be directly coupled to its nearest bond pad using relatively short interconnect lines. This minimizes the resistive, capacitive, and inductive effects associated with routing interconnect lines over long distances, improving speed performance.

FIG. 2b is an illustration of a cross-section of IC device 20 after being mounted to a package substrate 22. In order to mount IC device 20 to package substrate 22, solder balls 24 are placed on each of bond pads 21 to electrically couple each bond pad 21 to its corresponding pad on package substrate 22. Each corresponding pad on package substrate 22 is, in turn, coupled to an external pin 23. Note that IC device 20 is mounted to package substrate 22 with its top side facing towards the package substrate. In contrast, IC device 11 of FIG. 1b is mounted to package substrate 15 with its top side facing away from the package substrate. In other words, in comparison to the method used to mount IC device 11 to its package substrate 15, IC device 20 is "flipped." For this reason, the design of IC device 20 illustrated in FIG. 2a and it's subsequent packaging method illustrated in FIG. 2b is referred to as flip-chip technology. The technology is also known as controlled collapse chip connection (C4), named after the package mounting technique of using solder to replace bond wires.

As can be seen in FIGS. 2a and 2b, the top of IC device 20 is obscured by bond pads 21, solder balls 24, and package substrate 22. Such is the case for all IC devices packaged using C4 technology. Therefore, it is impossible to probe the circuitry of IC device 20 in the conventional manner described above since the circuitry of IC device 20 cannot be accessed from its top side.

Alternative techniques have been employed to permit access to the interconnect lines on top of IC device 20 so that these lines can be probed. One technique involves redesigning the C4 IC device so that it can be packaged in a conventional wire bond package. The redesigned wire bond packaged IC device may then be probed from the top of the silicon substrate in a more conventional manner. Unfortunately, the C4 IC device redesigned for wire bond packaging functions differently in a wire bond package than it would in its intended C4 package. As a result, the debugging process is hindered by the fact that electrical data collected during probing of the redesigned C4 IC device may not accurately reflect actual performance of the device when packaged in its native, C4 package environment.

A method is needed whereby a C4 IC device can be probed while in its native C4 package environment. This would allow electrical data to be collected from the IC device which reflects the true performance of the device as it was intended to operate.

SUMMARY OF THE PRESENT INVENTION

A method is described for accessing a portion of an integrated circuit formed on top of a semiconductor substrate from the bottom of the semiconductor substrate. First, alignment marks are located which are approximately aligned to the integrated circuit. These alignment marks are then used in conjunction with a circuit diagram of the integrated circuit to determine the point on the bottom of the semiconductor substrate residing beneath the portion of the integrated circuit which the practitioner desires to access. Finally, an opening is etched into the bottom of the semiconductor substrate at this point.

DETAILED DESCRIPTION

A method of probing a C4 packaged integrated circuit (IC) device is described. In the following description, numerous specific details such as etch depths, process sequences, material compositions, etc. are set forth in order to provide a more thorough understanding of the present invention. However, it will obvious to one skilled in the art that the present invention may be practiced without employing these specific details. In other instances, well-known processes and processing techniques and equipment have not been described in detail in order to avoid unnecessarily obscuring the present invention.

While diagrams representing an embodiment of the present invention are illustrated in FIGS. 3a–f, these illustrations are not intended to limit the invention. The specific processes described herein are only meant to help clarify an understanding of the present invention and to illustrate an embodiment of how the present invention may be implemented in order to achieve a desired result. For the purposes of this discussion, a semiconductor substrate is a substrate comprising any material or materials used in the manufacture of a semiconductor device. A substrate is a structure on which or to which a processing step acts upon.

There are two relatively distinct aspects to the present invention which work together in order to allow a practitioner to probe an IC device (or "chip") from the bottom of the semiconductor substrate upon which the IC is formed. First, a method is proposed which allows virtual navigation through the circuitry of the chip from the bottom of the chip. The navigational method offered herein permits a practitioner to accurately determine a point on the bottom of the chip residing directly below a corresponding point in the circuitry on top of the chip which the practitioner desires to probe (the probe point). Second, various techniques are offered herein whereby a hole is etched through the bottom of the chip in order to allow probing of the probe point.

Figure 1A:
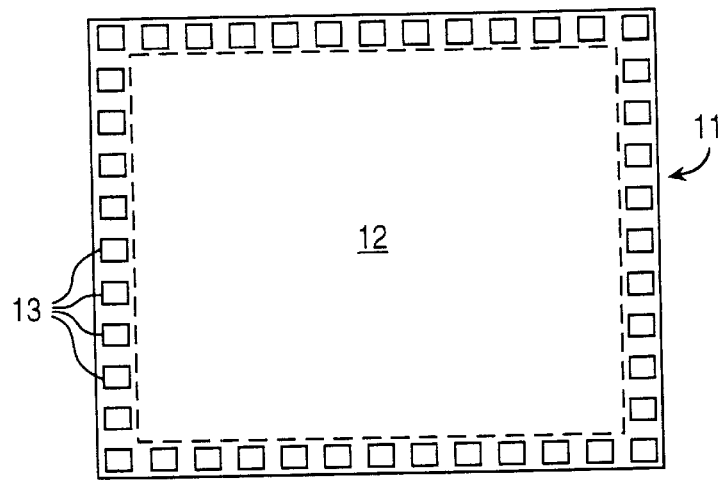
FIG. 1a is an illustration of an IC device intended for wire bond packaging.
Figure 1B:
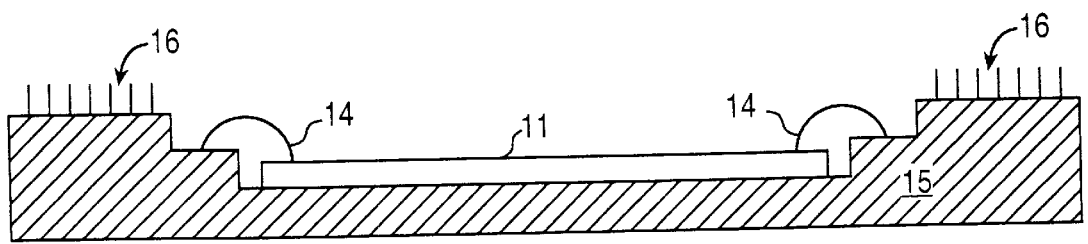
FIG. 1b is an illustration of a cross-sectional view of the IC device of FIG. 1a after the device has been packaged.
Figure 2A:
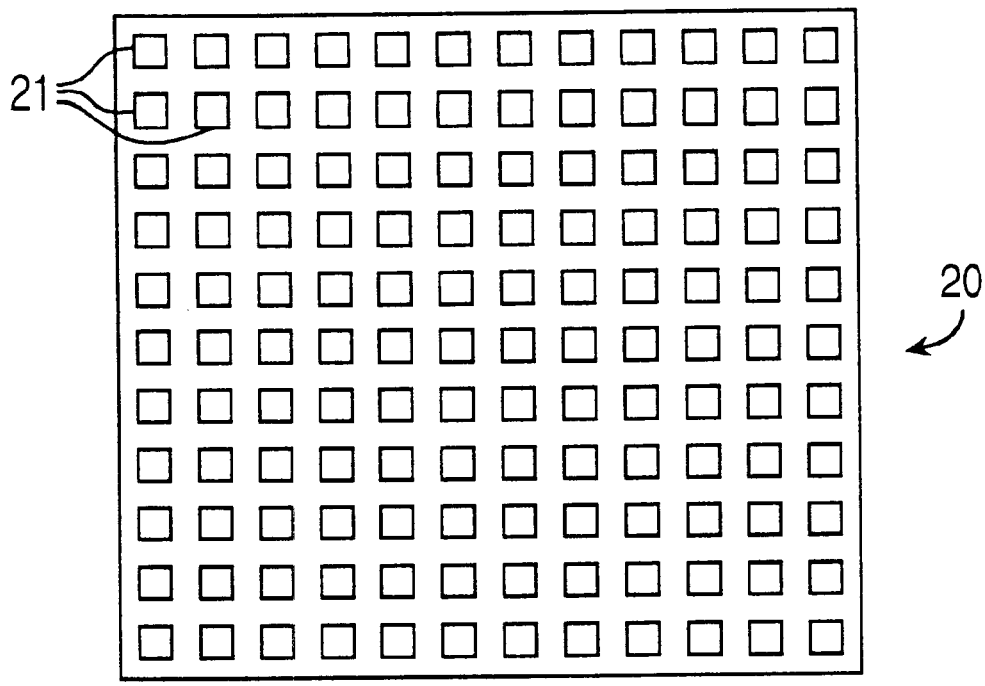
FIG. 2a is an illustration of an IC device intended for C4 packaging.
Figure 2B:
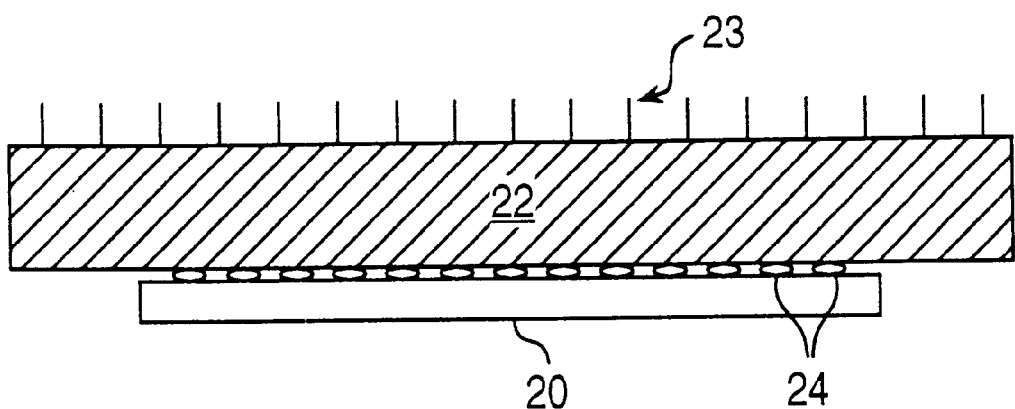
FIG. 2b is an illustration of a cross-sectional view of the IC device of FIG. 2a after the device has been packaged.
Figure 3A:
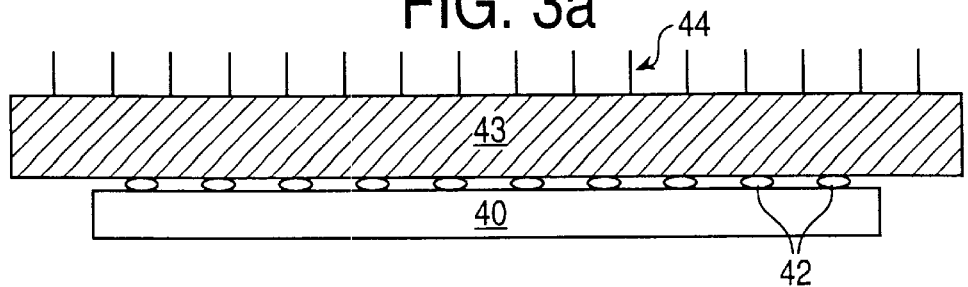
FIG. 3a is an illustration of a cross-sectional view of an IC device in a C4 package.

FIG. 3a illustrates a cross-section of a C4 packaged chip, similar to the C4 packaged chip described above in conjunction with FIGS. 2a and 2b. Chip 40 has an integrated circuit formed on its top side, above which, bond pads have been created. Each of these bond pads on top of chip 40 are electrically coupled to a corresponding pad on package substrate 43 through a solder ball 42. Each corresponding pad on package substrate 43 is, in turn, coupled to an external pin 44. These pins may be inserted into an appropriate socket for operation of the IC device.

The thickness of chip 40 is in the range of approximately 400–700 microns, but it is only the upper 10 to 15 microns of chip 40 in which active circuitry resides. It is this active circuitry which is to be probed in accordance with the present invention. The remainder of chip 40 primarily comprises an inactive silicon substrate. To shorten the amount of time it takes to etch holes through the bottom of this underlying, thick silicon substrate (as described in greater detail below), the first step in accordance with the present invention is to globally thin chip 40 by mechanical polishing.

Figure 3B:
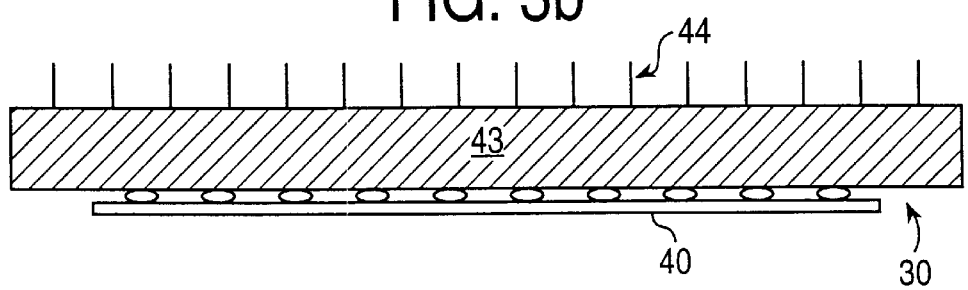
FIG. 3b is an illustration of a cross-sectional view of the C4 packaged IC device of FIG. 3a after a bottom portion of the silicon substrate of the IC device has been globally thinned.

In this first step, the majority of the silicon substrate of chip 40 is removed from the bottom of the chip by the mechanical polishing process. FIG. 3b illustrates the cross-section 30 of FIG. 3a after chip 40 has been globally thinned to a thickness within the range of approximately 50–150 microns. In accordance with the present invention, the silicon substrate of chip 40 is etched back to be as thin as possible without breaking or otherwise significantly impacting the performance of the circuitry on top of the chip. Alternatively, the silicon substrate of chip 40 may be etched back by chemical mechanical polishing, reactive ion etching (RIE), plasma etching, wet etching, or any combination of these techniques. Where the semiconductor substrate of chip 40 comprises a semiconductor material other than silicon, the appropriate etch chemistries are employed.

In alternate embodiments, globally thinning chip 40 may adversely affect operation of the IC device, affecting, for example, speed, latch-up characteristics, or thermal properties. In addition, other IC's or discrete components may be mounted to the bottom of chip 40, making global thinning impossible. Furthermore, other special materials may be formed on the bottom of the chip to aid in the manufacturing or operation of the IC device. In such cases, the step of globally thinning chip 40 by etching the bottom of the silicon substrate is skipped, and the practitioner may proceed directly to the next process step illustrated in FIG. 3c.

FIG. 3b illustrates a surface view 31 of the bottom of the C4 packaged chip 40 having the cross section 30. To ensure proper electrical coupling between package pins 44 and the circuitry of chip 40, the bond pads on top of chip 40 are aligned to the corresponding pads on package substrate 43 so that the solder balls 42 can properly couple the two together. Package fiducials 33 are alignment marks which have been formed on the package substrate and are aligned to the pads on package substrate 43. Therefore, by aligning chip 40 to the package substrate pads, chip 40 is aligned to package fiducials 33 and to the x-y coordinate system established by these package fiducials.

The x-y coordinate system illustrated in FIG. 3b is used in conjunction with a circuit diagram of chip 40 to roughly locate points along the bottom surface of chip 40 which lie directly below corresponding, determinable points in the circuitry on top of chip 40. For example, when chip 40 is accurately aligned to package fiducials 33, chip 40 is offset from both the x-axis and the y-axis by a known amount. The x and y coordinates of a point on the bottom of chip 40 are determined by precise measurement from the x and y axes. The known axes offset values are then subtracted from the measured x-y coordinates of the point. Then, by referencing the resulting coordinates on a circuit diagram of chip 40, one can determine the corresponding point in the circuitry on top of chip 40 which resides directly above the point on the bottom of chip 40. Of course, this positioning scheme may be worked in reverse to locate a point on the bottom of chip 40 which resides directly below a corresponding point in the circuitry on top of chip 40. Thus, one can navigate through the circuitry on top of chip 40 by coordinated positioning along the bottom of chip 40.

Unfortunately, due to current package technology limitations, chip 40 is not always accurately aligned to package fiducials 33, so the offset of chip 40 from the x and y axes is not a constant. Rather, this offset is known to fall within a range of values which may vary by as much as 200 microns or more. Therefore, the method described above of locating a point on the bottom of chip 40 residing directly below a corresponding point in the circuitry on top of chip 40 may only be used as an approximation. Alternatively, points on the bottom of chip 40 corresponding to points in the circuitry on top of chip 40 may be determined by measurement directly from the edge of chip 40. However, since the edge of chip 40 is non-uniform, this method may only be used as an approximation as well.

The next step in accordance with the present invention is to use the x-y coordinate system established by package fiducials 33 in the manner described above to determine the approximate location of features on chip 40 known as chip fiducials. Chip fiducials are alignment marks designed into the first metal layer (M1) of the chip and, in accordance with the present invention, are placed in at least three corners of the chip. Chip fiducials are used in a manner similar to package fiducials 33, but since chip fiducials are located within the circuitry on top of chip 40, they are self-aligned to the circuitry on chip 40 thereby allowing more precise navigation from the bottom of the chip.

Alternatively, chip fiducials may be formed from other layers of the chip. For example, chip fiducials may be formed from field oxide, diffusion regions, polysilicon, or any other interconnect layer. It may be beneficial for the chip fiducials to be formed from the same semiconductor layer which the practitioner desires to probe. One reason for this is to avoid errors in locating the probe point resulting from misalignment between semiconductor layers of the IC. Another reason is that the vertical distance to the probe point may be determined using coordinate information from chip fiducials formed in the same plane as the probe point (described in more detail below). Also, in an alternate embodiment, only two chip fiducials are placed on the chip. These two fiducials are placed in opposite corners of the chip to accommodate alignment of the chip to its circuit diagram.

Figure 3C:
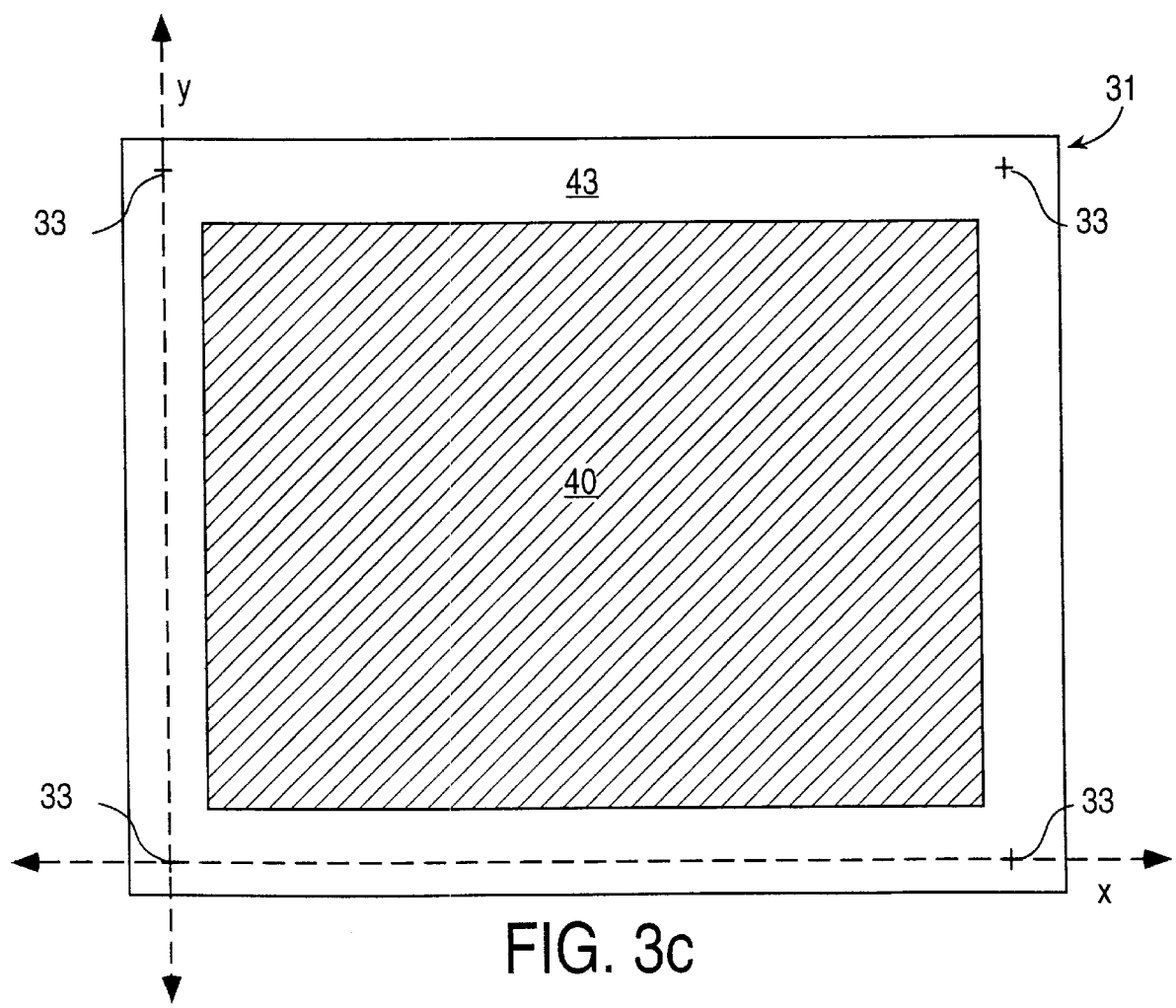
FIG. 3c is an illustration of a surface view of the C4 packaged device of FIG. 3a after a bottom portion of the silicon substrate of the IC device has been globally thinned.

Using the x-y coordinate system established by package fiducials 33, the approximate locations on the bottom of chip 40 residing directly below the three M1 chip fiducials on top of chip 40 are determined. Once determined, a gas-assisted laser etching system is used to etch alignment holes through the bottom of chip 40 at these locations to expose the three M1 chip fiducials on top of the chip. FIG. 3c illustrates the C4 packaged chip of FIG. 3b after the underlying silicon substrate has been etched, and the three M1 chip fiducials 35 have been exposed in accordance with the present invention.

The gas-assisted laser etching system uses an etch chemistry having a high selectivity of silicon over silicon dioxide. In this manner, after etching the silicon substrate from alignment hole regions 34 through the bottom of chip 40, the system stops at the silicon-silicon dioxide interface at the top of chip 40. Note that in some cases it may be necessary to form a large metal barrier in a metal layer above the M1 chip fiducial to shield the laser beam from penetrating all the way to package substrate 43 through the silicon dioxide in alignment hole 34. Alternatively, other etching techniques may be used to etch alignment hole 34. For example, one or more alignment holes may be etched by patterning and chemically etching the bottom of chip 40 using a wet or dry etch. Laser ablation or focused ion beam (FIB) etching may also be employed; however, these methods may not accommodate end point detection methods.

As stated above, due to the misalignment between chip 40 and package fiducials 33, only the approximate location of chip fiducials 35 can be determined from the bottom of chip 40 using package fiducials 33 as reference. Therefore, it is necessary that chip fiducials 35 and alignment holes 34 be large enough to account for any possible misalignment between chip 40 and package fiducials 33. However, there are significant trade-offs to consider.

For example, depending on the etching method used, it can take longer to etch a larger alignment hole than a smaller alignment hole. As a result, increasing the size of the alignment hole increases the throughput time of probing the chip. Also, by etching large holes into the silicon substrate, the performance of the chip may be affected, so electrical data gathered by the probing method of the present invention may not accurately reflect natural operation of the chip in its native environment. In addition, the chip may be destroyed if the alignment hole is made large enough to etch through a nearby diffusion region or other active circuitry of the chip.

Therefore, it is currently desirable to keep alignment hole 34 as small as possible while still being able to locate chip fiducial 35 from the bottom of chip 40 using package fiducials 33 for guidance.

While increasing the size of chip fiducial 35 improves a practitioner's ability to locate the fiducial, increasing the size also reduces the available area on top of chip 40 where circuitry can be formed. Therefore, it is also desirable to keep chip fiducial 35 as small as possible while still being able to locate this fiducial from the bottom of chip 40 using package fiducials 33 for guidance. In one embodiment, chip fiducials 35 are each approximately 150 microns end to end, and alignment hole 34 is approximately 50 by 50 microns. As alignment accuracy between chip 40 and package fiducials 33 improves, chip fiducial 35 and alignment hole 34 may be proportionately minimized in size since the accuracy in locating the chip fiducial from the package fiducials will proportionately improve. Alternatively, alignment accuracy may advance to the level where the probe point may be located directly from the package fiducials.

Once the silicon substrate has been removed from alignment hole 34 of chip 40, M1 chip fiducial 35 can be viewed through the transparent silicon dioxide film separating M1 from the silicon substrate. Chip fiducials 35 are then used in conjunction with a circuit diagram of chip 40 to more precisely locate the point on the bottom of chip 40 which resides directly below the probe point in the circuitry on top of chip 40 (described in more detail below). In an alternate embodiment, only a small, discernible portion of a chip fiducial need be exposed through an alignment hole. Only enough of the chip fiducial needs to be visible through the alignment hole to allow a practitioner to identify and locate the corresponding portion of the chip fiducial on a circuit diagram of chip for use in referencing the circuit diagram to the actual chip.

Once three alignment holes 34 have been etched to expose M 1 chip fiducials 35 through the bottom of chip 40, as illustrated in FIG. 3c, M1 chip fiducials 35 are used to enable virtual navigation through the circuitry of chip 40 from the bottom of the chip. The C4 packaged chip of FIG. 3c is affixed to a high precision, computer controlled positioning stage. Then, using chip fiducials 35 for alignment, a computer-based circuit diagram of chip 40 is electronically merged with the stage position of chip 40 on the computer's display screen. As a result, one can accurately determine the location of any point on the bottom of chip 40 residing directly below its corresponding point in the circuitry on top of chip 40 by referencing the computer-based circuit diagram displayed on the computer screen. Thus, a virtual navigation method is enabled. Note that this navigational technology is currently available on analytical equipment such as FIB etchers, but has heretofore been limited to top side navigation only.

While only two chip fiducials 35 may be required to align the chip's circuit diagram to the backside of the chip, a third fiducial is used to correct for tilt angle and backside thickness non-uniformities of chip 40. The plane defined by these three M1 chip fiducials establishes the plane in space in which the M1 layer of chip 40 resides. It is within this plane that the desired probe point is located. The M1 plane defined by the three M1 chip fiducials is used to determine how deep a hole must be etched through the bottom of chip 40 before reaching the desired probe point in the first metal layer of the chip. In other words, while aligning a circuit diagram to two chip fiducials provides for two dimensional x and y navigation, a third fiducial introduces a vertical z coordinate for three dimensional navigation. Depth of focus measurements are used to measure distances in the z direction.

Alternatively, two or more chip fiducials may be used to define a two dimensional coordinate system for navigation. In this embodiment, proper etch depths may be determined by, for example, an etch endpoint detection technique, timed etch, or depth measurement comparisons to known depths. In an alternate embodiment, any number of fiducials or other alignment marks are revealed by etching through the bottom of chip 40 in order to establish a coordinate system. In embodiments of the present invention in which a probe point resides in a layer other than the M1 layer, fiducials in this alternate layer are revealed in a similar manner. These fiducials are then similarly aligned to circuit diagrams of the chip in order to establish a navigational system substantially as described above. Also, fiducials in a first layer may be aligned to a circuit diagram in a method for locating and probing a probe point residing in the first or a second layer.

Note that the circuit diagrams used for navigation from the bottom of chip 40 must be "flipped" with respect to conventional circuit diagrams. In accordance with the present invention, navigation is performed by aligning the underside (or flip-side) of the circuitry formed on chip 40 to the flip-side of its respective circuit diagram. In contrast, traditional circuit location methods align the circuitry on top of the chip to its conventional, top-side circuit diagram.

As an alternative to the computer-aided, virtual navigation technique described above, M1 chip fiducials 35 may be used to establish an x-y coordinate system just as package fiducials 33 were used. The x-y coordinate system established by chip fiducials 35 is used in conjunction with a circuit diagram of chip 40 to accurately locate points along the bottom surface of chip 40 which lie directly below corresponding, determinable points in the circuitry on top of chip 40. For example, the x and y coordinates of a point on the bottom of chip 40 can be determined by precise measurement from the x and y axes. By comparing these coordinates to a circuit diagram of chip 40, one can determine the corresponding point in the circuitry on top of chip 40 which resides directly above the point on the bottom of the chip 40. As before, this scheme may be worked in reverse to locate a point on the bottom of chip 40 which resides directly below a corresponding point in the circuitry on top of chip 40. Thus, one can navigate through the circuitry on top of chip 40 by coordinated positioning along the bottom of chip 40.

Figure 3D:
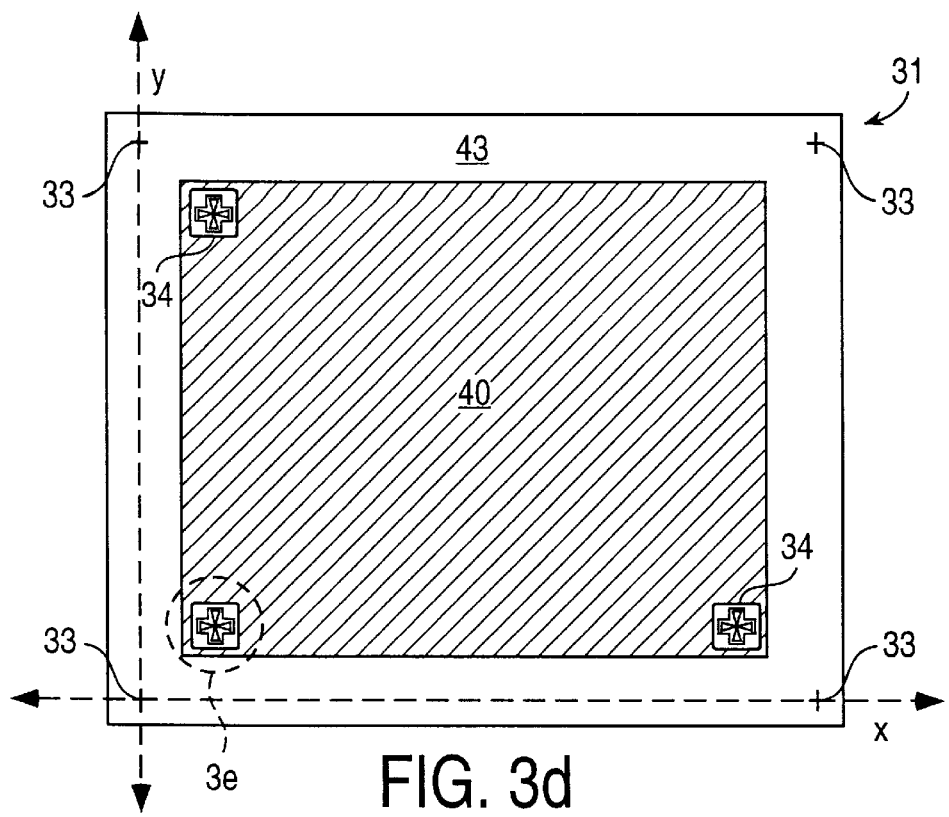
FIG. 3d is an illustration of a cross-sectional view of the C4 packaged IC device of FIG. 3c after alignment holes have been etched to expose three fiducials.

Using the virtual navigation method described above, the point on the bottom of chip 40 that resides directly below the probe point in the M1 layer on top of chip 40 is located. Once located, this region is locally thinned using a gas-assisted laser etching system. Local thinning is a process by which the majority of the remaining silicon substrate is removed in the local region underneath the probe point. FIG. 3d illustrates a cross-sectional view of the C4 packaged chip of FIG. 3c after region 45 has been locally thinned using a gas-assisted laser etching system.

The size of locally thinned region 45 depends on the size and location of the probe point within the circuitry on top of chip 40. In accordance with the present invention, to probe an M1 interconnect line approximately 1 micron wide, locally thinned region 45 is in the range of approximately 100 by 100 microns to 300 by 300 microns centered about the location directly beneath the probe point. However, because multiple probe points may be accessed by etching multiple probe holes through the locally thinned region, one may wish to thin a larger region to gain access to multiple probe points which may be a large distance apart from each other. For example, a region greater than 500 by 500 microns may be locally thinned where one desires to probe individual interconnect lines which are approximately 500 microns apart.

The sidewall profile of locally thinned region 45 depends on the method used to etch this region and the practitioner's requirements. In accordance with the present invention as illustrated in FIG. 3d, thinned region 45 has graded sidewalls formed by etching out layers of progressively smaller sections of the silicon substrate using the gas-assisted laser etching system. The dimensions of the largest, outermost section in the first layer etched from region 45 is approximately 200 by 200 microns. The dimensions of the smallest, innermost section in the final layer etched from region 45, closest to the top of chip 40, is approximately 100 by 100 microns.

Figure 3E:
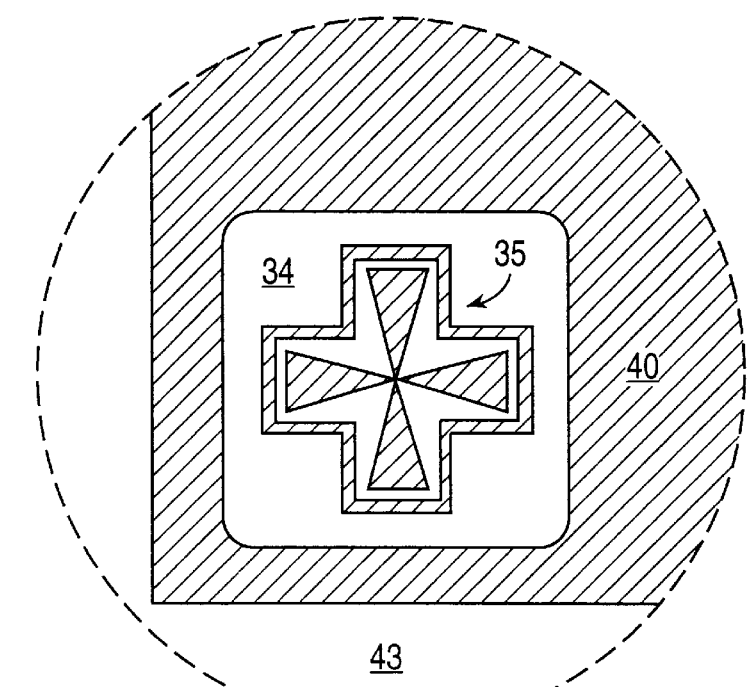
FIG. 3e is an enlarged view of a fiducial shown in FIG. 3d.

FIG. 3e illustrates an enlarged view of locally thinned region 45 of the C4 packaged chip of FIG. 3d. The graded, stair-step profile, 54, formed by the gas-assisted laser etching method described above is illustrated where each step represents a layer of progressively smaller sections of the silicon substrate which have been etched from the region. In an alternate embodiment, where local thinning is accomplished by other laser techniques, patterning and chemically etching the region, FIB etching, or any combination of techniques, the sidewalls may be graded, vertical, or undercut. In general, the size, shape, and sidewall profile of the locally thinned region should be selected to minimally interfere with device performance, accommodate subsequent probe hole formation, and permit probing of the circuitry.

Cross-sections of three M1 interconnect lines 49 are illustrated in the enlarged view of locally thinned region 45 in FIG. 3e. These three interconnect lines represent the probe points to be probed in accordance with the present invention. Layer 47 comprises an electrically insulating silicon dioxide material used to isolate M1 interconnect lines 49 from each other, from the underlying silicon substrate 46, and from the rest of the circuitry of chip 40. The remaining layers of the integrated circuit, including additional metal interconnect and dielectric layers, reside in region 48.

Depth 50 is the distance from the M1 layer to the opening of locally thinned region 45. Depth 50 is in the range of approximately 3 to 25 microns. Therefore, it is necessary to etch region 45 to within approximately 3 to 25 microns below the desired probe point in the M1 layer of chip 40. The three dimensional navigation method described above makes this possible. By using the three M1 chip fiducials to define the plane in which the M1 layer of the chip resides in an xyz coordinate system, region 45 can be etched to a depth (z coordinate) within the required range. Locally thinned region 45 is not etched all the way through silicon substrate 46 to silicon dioxide layer 47 because this would destroy electrically active regions within silicon substrate 46 such as diffusion regions. Alternatively, in an embodiment in which the location of the M1 plane is not defined, the proper depth of thinned region 45 may be achieved by using an etch endpoint detection technique, timed etch, depth measurement comparisons to known depths, or any combination thereof.

In order to probe M1 interconnect lines 49, probe holes are etched through silicon substrate 46 and through a portion of silicon dioxide layer 47 to allow electron-beam ("e-beam") probing of interconnect lines 49 from the bottom of chip 40. Therefore, in order to prevent the integrated circuit from being destroyed during etching of these probe holes, there is no active circuitry underneath M1 interconnect lines 49 at the probe points. In other words, the portions of interconnect lines 49 to be probed reside over isolation regions or other inactive regions of the integrated circuit. Probe holes etched through isolation or other inactive regions will not significantly disrupt performance of the chip.

The location of a probe hole must be determined with much higher precision than the location of locally thinned region 45 since an improperly placed probe hole can destroy the chip if etched through an important IC component such as a transistor. Therefore, an FIB etching system is used to etch these probe holes. Typical FIB etching systems use highly precise electron microscopy methods to generate images and coordinate information from the substrate being etched. In accordance with the present invention, after thinning region 45 in a gas-assisted laser etching system, the chip is transferred to an FIB system and the circuit diagram of chip 40 is realigned to the M1 fiducials using the more precise electron microscopy methods available in FIB systems.

Unfortunately, electron microscopes cannot resolve images through a silicon dioxide layer. Therefore, in order to align the circuit diagram of chip 40 to its M1 fiducials in an FIB system, the alignment holes need to be further etched through the silicon dioxide insulation layer to expose portions of the M1 fiducials. Etching of the alignment holes is accomplished using the FIB etching system. Once exposed, these portions of the M1 fiducials are used substantially as described above to define the plane in which the M1 layer of the chip resides in an xyz coordinate system. By electronically overlaying and aligning the computer-based circuit diagram of chip 40 to the M1 fiducials, virtual navigation through the circuitry of the chip is again enabled. Using this method, the point within locally thinned region 45 residing directly beneath the desired probe point of the circuit can be more accurately determined.

Figure 3F:
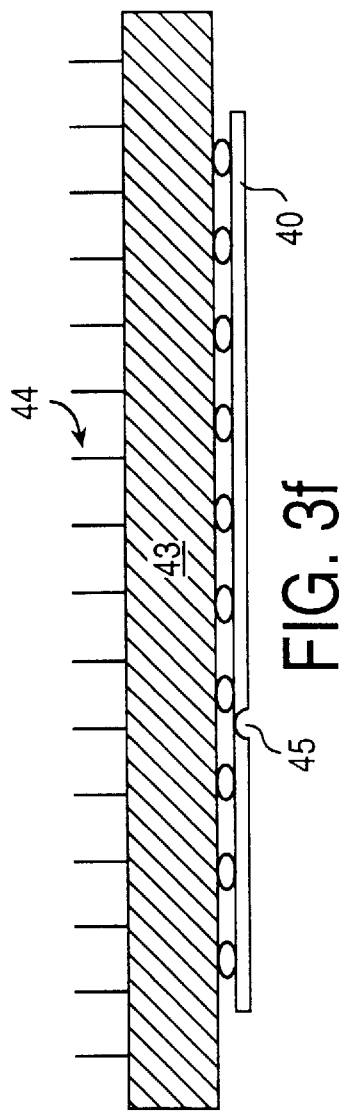
FIG. 3f is an illustration of a cross-sectional view of the C4 packaged IC device of FIG. 3c after a bottom portion of the silicon substrate of the IC device has been locally thinned.
Figure 3G:
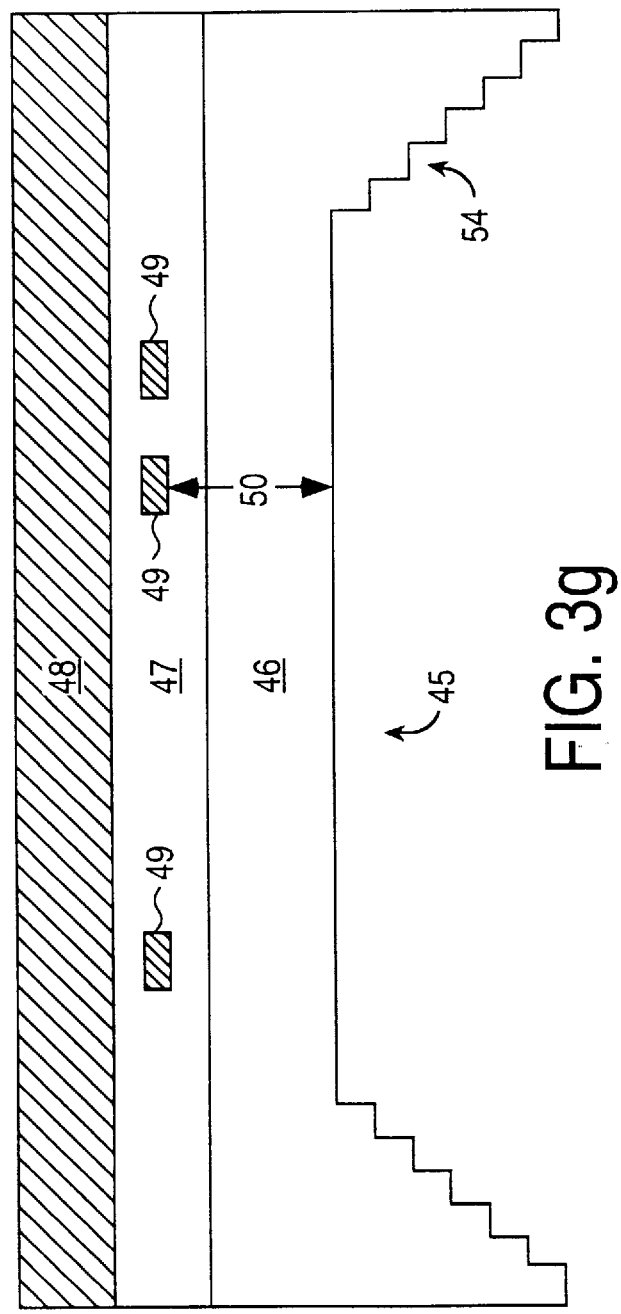
FIG. 3g is an illustration of a cross-sectional view of the IC device of FIG. 3f within the locally thinned region.
Figure 3H:
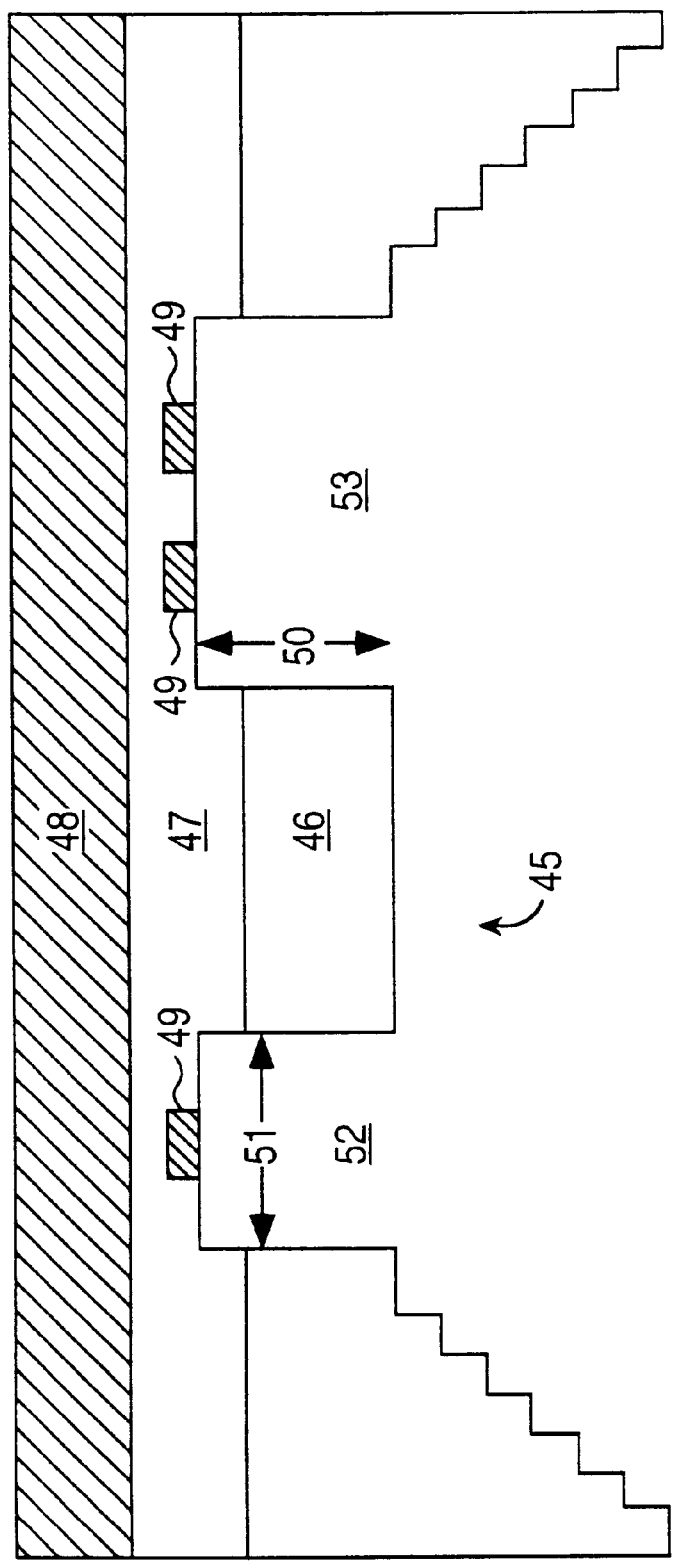
FIG. 3h is an illustration of a cross-sectional view of the IC device of FIG. 3g after probe holes have been etched.

FIG. 3f illustrates the substrate of FIG. 3e after two probe holes 52 and 53 have been etched using a focused ion beam etching system to finally access the probe points of interconnect lines 49. Where one desires to probe only a single metal line, as illustrated by probe hole 52, the probe hole is etched having a diameter 51 in the range of approximately 2 to 6 microns. Where one desires to access multiple metal lines within a single probe hole, as illustrated by probe hole 53, a wider probe hole may be etched, taking care not to etch through any electrical components of the circuit.

Alternatively, the diameter 51 of a minimally sized probe hole 52 may be reduced below 2 microns; however, a practitioner must consider the feasibility of probing metal interconnect lines through high aspect ratio probe holes. Generally, a probe hole aspect ratio (depth/width) of less than three sufficiently allows a metal interconnect line to be probed by an e-beam probing system. Current e-beam probing technology dictates that the width of an interconnect line 49 at the probe point be at least 1 micron to obtain reliable electrical information from the interconnect line. Naturally, narrower lines may be probed as probing and etching technologies advance.

In an embodiment in which the location of the M1 plane is not defined, probe holes 52 and 53 may be etched using an etch endpoint detection technique, timed etch, depth measurement comparisons to known depths, or any combination thereof. For example, one may detect when the etch of probe holes 52 and 53 reach the interface between silicon substrate 46 and silicon dioxide layer 47, and provide sufficient over-etch to access M1 interconnect lines 49. Note that the proffered method of etching probe holes to M1 interconnect lines may be employed for etching probe holes to alternate regions of the circuit as well.

For example, in one embodiment, a diode diffusion region coupled to an M1 interconnect line is probed. Many such diffusion regions may already exist in typical IC devices to, for example, protect gate oxide damage during the manufacturing process. In this embodiment, the IC is aligned to fiducials in the diffusion region and the probe hole is etched to the diffusion region probe point substantially as described above. In another embodiment, the probe point resides in a polysilicon or other metal layer of the chip. Higher metal layers of the chip are accessed in situations where the M1 line is too small or otherwise inaccessible from the bottom of the chip. In such embodiments, the IC may be specially designed to accommodate bottom-side probing. Also, in an alternate embodiment, a laser etching system or other etch technique such as, for example, photomask and dry etch, may be used to etch probe holes.

Once the underside of metal interconnect lines 49 have been exposed by probe holes 52 and 53, an e-beam probing system is used to obtain electrical data from M1 interconnect lines 49 through the bottom of the chip while operating the chip through the C4 package from the top. Alternatively, mechanical, laser, or infrared probing may be used to obtain electrical data from the probe point.

Thus a method for electrically probing an integrated circuit from the bottom of the chip has been described. This method may be found useful in debugging applications where access to the IC device is obscured by, for example, the package technology employed.

What is claimed is:

1. A method of probing a portion of an integrated circuit formed in a semiconductor substrate, said method comprising the steps of:
   a) etching a first alignment hole, a second alignment hole and a third alignment hole through the bottom of said semiconductor substrate to expose a first alignment fiducial, a second alignment fiducial and a third alignment fiducial, said third alignment fiducial being used in conjunction with said first alignment fiducial and said second alignment fiducial to define the plane in which said first, second, and third alignment fiducials reside;
   b) using said first alignment fiducial and said second alignment fiducial to locate a region on said bottom of said semiconductor substrate residing beneath said portion of said integrated circuit;
   c) etching an opening within said region, the definition of said plane being used to determine the depth of at least a portion of said opening; and
   d) probing said portion of said integrated circuit through said opening.

2. The method of claim 1 wherein said region on said bottom of said semiconductor substrate residing beneath said portion of said integrated circuit is located by aligning said first and said second alignment fiducials to a circuit diagram of said integrated circuit, locating said portion of said integrated circuit on said circuit diagram, and determining the corresponding region on said bottom of said semiconductor substrate residing beneath said portion of said integrated circuit.

3. The method of claim 1 wherein said first and said second alignment fiducials are formed from metal in a first metal layer of said integrated circuit, and said portion of said integrated circuit comprises a segment of a metal interconnect line in said first metal layer of said integrated circuit, said segment having been formed over an isolation region of said semiconductor substrate.

4. The method of claim 1 wherein said first, second and third alignment fiducials are formed from diffusion regions of said integrated circuit, and said portion of said integrated circuit comprises a diffusion region of said integrated circuit.

5. The method of claim 1 wherein a first portion of said opening is etched using a gas-assisted laser etching system to locally thin said semiconductor substrate.

6. The method of claim 5 wherein said semiconductor substrate is etched to a depth of within 3 to 25 microns of said portion of said integrated circuit.

7. The method of claim 6 wherein a second portion of said opening is etched using a focused ion beam etching system to physically expose the underside of said portion of said integrated circuit.

8. A method of accessing a point located on the top side of a semiconductor substrate from a bottom side of said semiconductor substrate comprising the steps of:
   a) locating a point on said bottom side of said semiconductor substrate residing below said point; and
   b) creating an opening in said bottom said semiconductor substrate at said point.

9. The method of claim 8 wherein said opening extends from said bottom side of said semiconductor substrate to said point.

10. The method of claim 8 wherein said point is located in an integrated circuit formed on said top side of said semiconductor substrate.

11. The method of claim 10 wherein said point of said integrated circuit comprisesa diffusion region of said integrated circuit.

12. The method of claim 10 wherein said point of said integrated circuit comprises a segment of a metal interconnect line in a first metal layer of said integrated circuit.

13. The method of claim 8 wherein said point comprises a segment of an alignment fiducial.

14. The method of claim 8 wherein said semiconductor substrate is affixed to a package, and the location of said point is determined by using alignment marks on said package in conjunction with a diagram of said top side of said semiconductor substrate to reference the location of said point.

15. The method of claim 10 wherein said semiconductor substrate includes a first set of bond pads located above said integrated circuit that are coupled to a corresponding second set of bond pads on a package at a plurality of solder interconnections, said package having alignment marks that are aligned to said second set of bond pads, the step of locating said point being determined by using said alignment marks in conjunction with a circuit diagram of said top side of said semiconductor substrate to reference the location of said point.

16. The method of claim 8 wherein the step of creating said opening includes etching said bottom side of said semiconductor substrate using a gas-assisted laser etching system.

17. The method of claim 8 wherein the step of creating said opening includes etching said bottom side of said semiconductor substrate using a focused ion beam etching system.

18. The method of claim 8 wherein a first portion of said opening is etched using a gas-assisted laser etching system, and a second portion of said opening is etched using a focused ion beam etching system, both etching systems employing virtual navigation techniques for locating said point on said bottom side of said semiconductor substrate.

19. The method of claim 8 wherein the step of locating said point comprises the step of etching a hole into said bottom of said semiconductor substrate to expose an alignment fiducial formed on said top of said semiconductor substrate, said alignment fiducial providing reference to said point.

20. The method of claim 10 further comprising the step of probing said point of said integrated circuit through said opening.

21. The method of claim 8 further comprising the step of polishing said bottom of said substrate to thin said substrate prior to creating said opening.

22. A method of providing electrical access to a portion of an integrated circuit formed on top of a semiconductor substrate, said method comprising the steps of:
 a) etching a first alignment hole through the bottom of said semiconductor substrate to expose a first alignment fiducial;
 b) using said first alignment fiducial to locate a region on said bottom of said semiconductor substrate residing beneath said portion of said integrated circuit;
 c) etching an opening within said region; and
 d) probing said portion of said integrated circuit through said opening.

23. The method of claim 22 further comprising the step of etching a second alignment hole through said bottom of said semiconductor substrate to expose a second alignment fiducial, said second alignment fiducial being used in conjunction with said first alignment fiducial to locate said region on said bottom of said semiconductor substrate residing beneath said portion of said integrated circuit.

24. The method of claim 22 wherein said portion of said integrated circuit comprises a diffusion region of said integrated circuit.

25. The method of claim 22 wherein said first alignment fiducial is formed from metal in a first metal layer of said integrated circuit, and said portion of said integrated circuit comprises a segment of a metal interconnect line in said first metal layer of said integrated circuit, said segment having been formed over an isolation region of said semiconductor substrate.

26. The method of claim 22 wherein said semiconductor substrate is affixed to a package, and the location of said first alignment hole is determined by using alignment marks on said package to reference the location of said first alignment fiducial.

27. The method of claim 22 wherein a first portion of said opening is etched using a gas-assisted laser etching system, and a second portion of said opening is etched using a focused ion beam etching system, both etching systems employing virtual navigation techniques for locating said region on said bottom of said semiconductor substrate residing beneath said portion of said integrated circuit.

28. A method of probing a portion of an integrated circuit formed on top of a semiconductor substrate, said method comprising the steps of:
 a) etching a first alignment hole and a second alignment hole through the bottom of said semiconductor substrate to expose a first alignment fiducial and a second alignment fiducial, respectively;
 b) using said first alignment fiducial and said second alignment fiducial to locate a region on said bottom of said semiconductor substrate residing beneath said portion of said integrated circuit;
 c) etching an opening within said region; and
 d) probing said portion of said integrated circuit through said opening.

29. The method of claim 28 further comprising the step of etching a third alignment hole through said bottom of said semiconductor substrate to expose a third alignment fiducial, said third alignment fiducial being used in conjunction with said first alignment fiducial and said second alignment fiducial to define the plane in which said first, second, and third alignment fiducials reside, the definition of said plane being used to determine the depth of at least a portion of said opening.

30. The method of claim 28 wherein said region on said bottom of said semiconductor substrate residing beneath said portion of said integrated circuit is located by aligning said first and said second alignment fiducials to a circuit diagram of said integrated circuit, locating said portion of said integrated circuit on said circuit diagram, and determining the corresponding region on said bottom of said semiconductor substrate residing beneath said portion of said integrated circuit.

31. The method of claim 28 wherein said first and said second alignment fiducials are formed from metal in a first metal layer of said integrated circuit, and said portion of said integrated circuit comprises a segment of a metal interconnect line in said first metal layer of said integrated circuit, said segment having been formed over an isolation region of said semiconductor substrate.

32. The method of claim 28 wherein said first and said second alignment fiducials are formed from diffusion regions of said integrated circuit, and said portion of said integrated circuit comprises a diffusion region of said integrated circuit.

33. The method of claim 28 wherein a first portion of said opening is etched using a gas-assisted laser etching system to locally thin said semiconductor substrate.

34. The method of claim 33 wherein said semiconductor substrate is etched to a depth of within approximately 3 to 25 microns of said portion of said integrated circuit.

35. The method of claim 34 wherein a second portion of said opening is etched using a focused ion beam etching system to physically expose the underside of said portion of said integrated circuit.

36. A method of locating a point on the bottom of a semiconductor substrate that is attached to a package, said point residing below a portion of an integrated circuit formed on top of said semiconductor substrate, said method comprising the steps of:
 a) locating at least one alignment mark on said package that is approximately aligned to said portion of said integrated circuit; and
 b) using said alignment mark to locate said point.

37. The method of claim 36 wherein said alignment mark is used in conjunction with a circuit diagram of said integrated circuit to locate said point.

38. The method of claim 36 further comprising the step of etching an opening into said bottom of said semiconductor substrate at said point to access said portion of said integrated circuit.

39. The method of claim 36 further comprising the step of etching an hole into said bottom of said semiconductor substrate to expose an alignment fiducial formed on said top of said semiconductor substrate, said alignment fiducial providing reference to said portion of said integrated circuit.

40. The method of claim 36 further comprising the step of polishing said bottom of said substrate to thin said substrate.

41. The method of claim 36 wherein said portion of said integrated circuit comprises a diffusion region of said integrated circuit.

42. The method of claim 36 wherein said portion of said integrated circuit comprises a segment of a metal interconnect line in a first metal layer of said integrated circuit.

43. The method of claim 38 further comprising the step of probing said portion of said integrated circuit through said opening.

44. The method of claim 38 wherein a first portion of said opening is etched using a laser, and a second portion of said opening is etched using a focused ion beam.

45. A method of locating a point on the bottom of a semiconductor substrate that is attached to a package, said point residing below an alignment fiducial formed on top of said semiconductor substrate, said method comprising the steps of:
   a) locating at least one alignment mark on said package that is approximately aligned to said alignment fiducial; and
   b) using said alignment mark to locate said point.

46. The method of claim 45 further comprising the step of etching a hole into said bottom of said semiconductor substrate to expose said alignment fiducial.

47. The method of claim 45 further comprising the step of etching a hole into said bottom of said semiconductor substrate to expose said alignment fiducial, said alignment fiducial providing reference to a portion of an integrated circuit formed on top of said semiconductor substrate.

48. The method of claim 47 further comprising the step of etching an opening in said bottom of said semiconductor substrate at a location below said portion of said integrated circuit.

49. The method of claim 48 further comprising the step of probing said portion of said integrated circuit through said opening.

50. The method of claim 45 further comprising the step of polishing said bottom of said substrate to thin said substrate.

51. The method of claim 47 wherein said portion of said integrated circuit comprises a diffusion region of said integrated circuit.

52. The method of claim 47 wherein said portion of said integrated circuit comprises a segment of a metal interconnect line in a first metal layer of said integrated circuit.

53. The method of claim 48 wherein a first portion of said opening is etched using a laser, and a second portion of said opening is etched using a focused ion beam.

54. A method of accessing a point located on the top side of a semiconductor substrate from a bottom side of said semiconductor substrate comprising the steps of:
   a) locating a point on said bottom side of said semiconductor substrate residing below said point;
   b) thinning said semiconductor substrate; and
   c) etching said bottom side of said semiconductor substrate using a focused ion beam to create an opening in said bottom side of said semiconductor substrate at said point.

55. The method of claim 54 wherein the step of thinning said semiconductor substrate comprises polishing said bottom side of said substrate.

56. The method of claim 54 wherein said opening extends from said bottom side of said semiconductor substrate to said point.

57. The method of claim 54 wherein said point is located in an integrated circuit formed on said top side of said semiconductor substrate.

58. The method of claim 57 wherein said point of said integrated circuit comprises a diffusion region of said integrated circuit.

59. The method of claim 57 wherein said point of said integrated circuit comprises a segment of a metal interconnect line in a first metal layer of said integrated circuit.

60. The method of claim 54 wherein said point comprises a segment of an alignment fiducial.

61. The method of claim 54 wherein said semiconductor substrate is affixed to a package, and the location of said point is determined by using alignment marks on said package in conjunction with a diagram of said top side of said semiconductor substrate to reference the location of said point.

62. The method of claim 57 wherein said semiconductor substrate includes a first set of bond pads located above said integrated circuit that are coupled to a corresponding second set of bond pads on a package at a plurality of solder interconnections, said package having alignment marks that are aligned to said second set of bond pads, the step of locating said point being determined by using said alignment marks in conjunction with a circuit diagram of said top side of said semiconductor substrate to reference the location of said point.

63. The method of claim 57 further comprising the step of probing said point of said integrated circuit through said opening.

* * * * *